United States Patent [19]
Gannon et al.

[11] Patent Number: 5,408,233
[45] Date of Patent: Apr. 18, 1995

[54] NOISE SOURCE FOR AN ANALOG-TO-DIGITAL CONVERTER

[75] Inventors: Mark A. Gannon, Sleepy Hollow; Joseph A. Charaska, Melrose Park, both of Ill.

[73] Assignee: Motorola, Inc., Schaumburg, Ill.

[21] Appl. No.: 99,273

[22] Filed: Jul. 29, 1993

[51] Int. Cl.[6] .............................................. H03M 1/20
[52] U.S. Cl. .................................................. 341/131
[58] Field of Search ................................ 341/131, 143

[56] References Cited

U.S. PATENT DOCUMENTS

| | | | |
|---|---|---|---|
| 3,999,129 | 12/1976 | Kasson | 341/131 |
| 5,073,777 | 12/1991 | Fukuhara et al. | 341/131 |
| 5,144,308 | 9/1992 | Norsworthy | 341/131 |

Primary Examiner—Howard L. Williams
Attorney, Agent, or Firm—Susan L. Lukasik

[57] ABSTRACT

A noise source (113 or 217) is coupled to an analog-to-digital converter (115 or 219) so as to remove at least some unwanted spectral components from the analog-to-digital converter (115 or 219) output. In one embodiment, the noise source (113 or 217) is comprised of a sigma-delta digital-to-analog modulator.

14 Claims, 2 Drawing Sheets

NOISE SOURCE FOR AN ANALOG-TO-DIGITAL CONVERTER

FIELD OF THE INVENTION

This invention relates to analog-to-digital converters, including but not limited to elimination of unwanted spectral components from analog-to-digital converter outputs.

BACKGROUND OF THE INVENTION

Analog-to-digital (A/D) converter circuits are known to comprise devices capable of converting analog wave forms into corresponding digital representations. Sigma-delta A/D converters are one type of A/D circuit known in the art. In a sigma-delta A/D converter, the analog wave form is input to an integrating lowpass filter, the output of which serves as input to a one-bit quantizer. The output of the one bit quantizer serves not only as the digital output of the sigma-delta A/D converter, but it is also fed back and summed with the analog input to produce a difference signal at the input of the integrating lowpass filter. An error signal is produced as the integrating lowpass filter operates on the difference signal. In essence, the sigma-delta A/D converter attempts to produce digital representations of the input signal such that the error signal is continually minimized. Ideally, the resulting power spectral density of the digital representation substantially matches that of the analog input, with the addition of quantization noise. The spectral shape of the quantization noise is greatly influenced by the frequency characteristics of the integrating lowpass filter.

Baseband sigma-delta A/D converters have a property that with certain integrator time constants, some input levels, e.g., certain dc input levels, can cause low-level tones to be present in the passband of the sigma-delta output, which can exhibit spurious outputs in the form of unwanted spectral components to be present when the signal is FM (frequency modulation) demodulated. Such tones are undesirable for a radio receiver, as the intended recovered signal will quite often be distorted and difficult to distinguish from noise. These tones can produce other deleterious effects depending upon the A/D converter's application.

A similar phenomenon occurs in other A/D converters, such as Flash converters, wherein passband tones can be produced with an input signal present combined with certain dc input levels. These tones are equally undesirable.

Typically, the integrating lowpass filter utilizes multiple integration stages to realize effective out-of band attenuation of quantization noise. A cost associated with the use of higher order integrating filters is their inherent instability. When an analog input becomes excessively large, this instability can result in uncontrollable oscillations at the output of the sigma-delta A/D converter, and hence, in the loss of information contained in the analog input. Only when the input has been sufficiently reduced will the oscillations cease and normal operations continue. This situation can be resolved in several ways. Rather than using multi-stage integrating filters, a single stage (single pole) filter can be used. Single pole integrating filters, referred to as first order filters, guarantee stability but do not offer sufficient noise suppression performance. Alternatively, the pole and zero location of the multiple integration stages can be altered to minimize instability, but at the expense of inferior spurious output performance.

Accordingly, there is a need for a sigma-delta A/D converter that reduces unwanted spectral components from the sigma-delta output without resulting in uncontrollable oscillations or poor noise suppression performance.

DESCRIPTION OF A PREFERRED EMBODIMENT

The following describes an apparatus for a noise source to an A/D converter that removes at least some unwanted spectral components from the A/D converter output. One embodiment of the noise source comprises a digital dither noise source that is easily and reliably implemented in an integrated circuit.

One embodiment comprises a noise source and an A/D converter having an output. The noise source, comprised of a sigma-delta digital-to-analog modulator, is coupled to the A/D converter so as to remove at least some unwanted spectral components from the A/D converter output. The A/D converter may be a sigma-delta A/D converter. The A/D converter may also be a second order sigma-delta A/D converter. If the A/D converter is a second order sigma-delta A/D converter, wherein the A/D converter has a first integrator followed by a second integrator, an improvement resides wherein the noise source is operatively coupled to the second integrator.

Another embodiment comprises a dither noise source and a sigma-delta A/D converter having an output. The dither noise source is operatively coupled to the sigma-delta A/D converter so as to remove at least some unwanted spectral components from the A/D converter output. In this embodiment, the sigma-delta analog-to-digital converter may be a second order sigma-delta analog-to-digital converter. If the sigma-delta analog-to-digital converter is a second order sigma-delta analog-to-digital converter, wherein the sigma-delta analog-to-digital converter has a first integrator followed by a second integrator, an improvement resides wherein the noise source is operatively coupled to the second integrator.

Yet another embodiment comprises a dither noise source and a sigma-delta A/D converter having an output and a first integrator followed by a second integrator. The dither noise source is operatively coupled to the second integrator so as to remove at least some unwanted spectral components from the A/D converter output. If the sigma-delta analog-to-digital converter is comprised of more than two integrators in a series of integrators, the second integrator appears last in the series of integrators.

Figure 1:
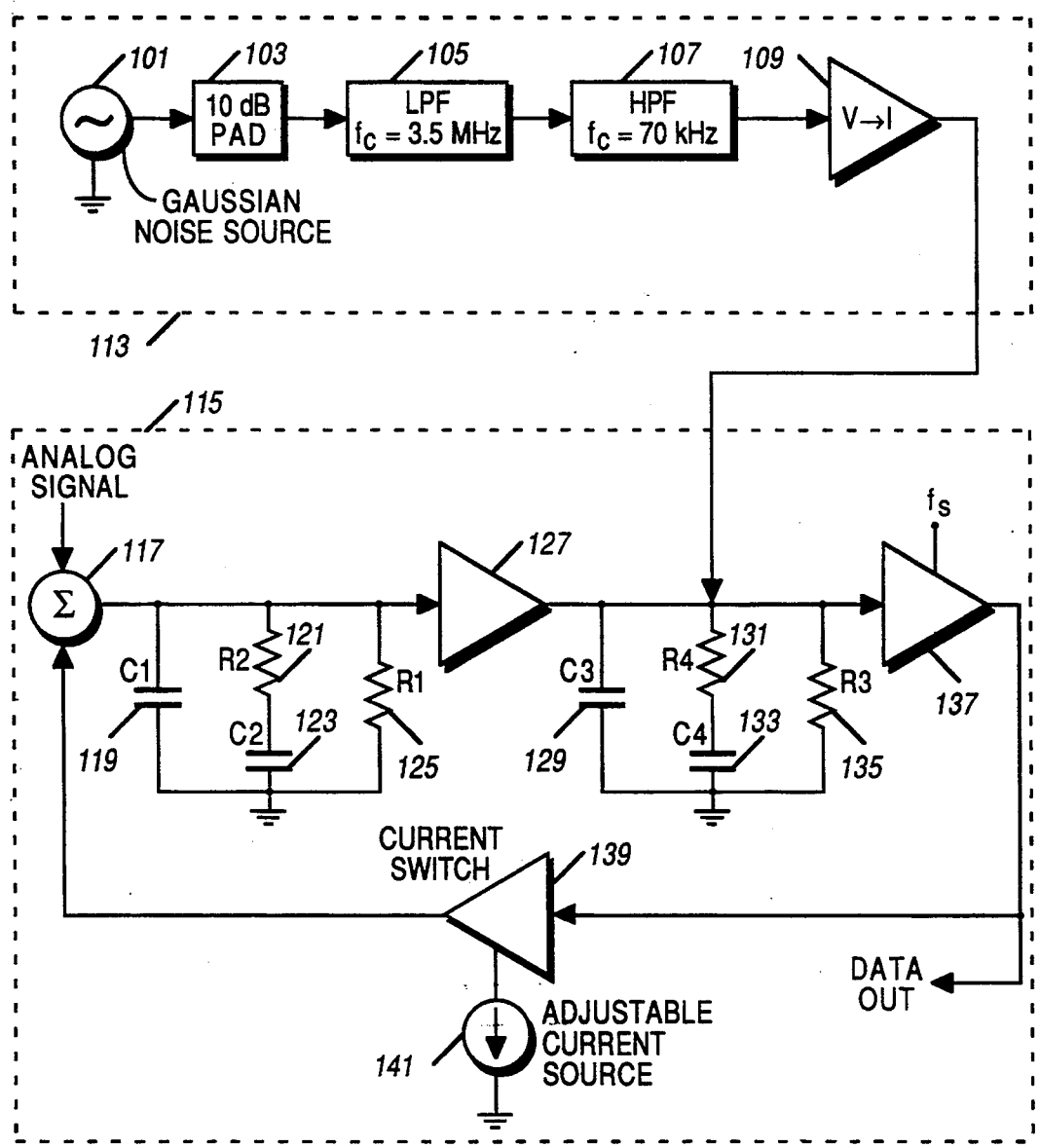
FIG. 1 is a block diagram of a sigma-delta A/D converter with a dither noise source in accordance with the invention.

A sigma-delta A/D converter with a dither noise source is shown in FIG. 1. The output of a gaussian noise source 101 is input to a 10 dB pad (attenuator) 103. One of skilled in the art would recognize that a weaker noise source with a smaller attenuator would also function here. The output of the 10 dB pad 103 is input to a lowpass filter 105 with cut-off frequency at 3.5 MHz. The output of the lowpass filter 105 is input to a highpass filter 107 with cut-off frequency of 70 kHz. The lowpass filter 105 and the highpass filter 107 effectively provide a bandpass filter. The output of highpass filter 107 is input to a voltage to current (V→I) converter 109. Blocks 101, 103, 105, 107, and 109 provide a dither noise source 113.

The output of the dither noise source is input to a sigma-delta A/D converter 115. The sigma-delta A/D converter includes blocks 117 through 141 inclusive. An analog signal is input to a summer 117 whose output is input to a loop gain block 127. Connected to the ground and the node between the summer 117 and the loop gain block 127 are a capacitor 119 of value C1, a resistor 125 of value R1, and a series connection of a second resistor 121 of value R2 and a second capacitor 123 of value C2. A similar parallel-series structure of resistors and capacitors is attached to the node at the output of loop gain block 127, with two resistors 131 and 135 and two capacitors 129 and 133. The output node of the loop gain block 127 is input to a sampling comparator 137 that samples at the frequency of provided signal $f_s$. The output of the dither noise source 113 is operatively coupled to the node between the loop gain block 127 and the sampling comparator 137. The output of the sampling comparator 137 is digital data and is also fed back into a current switch 139, the output of which is input to the summer 117. The current switch is attached to an adjustable current source 141.

The integrating lowpass filter shown in FIG. 1 includes blocks 119 through 135 inclusive and is implemented with capacitors, resistors and gain blocks. More filter poles and zeros may be added by cascading one or more additional similar parallel-series structures of resistors and capacitors and gain blocks. It is understood that the stages of the integrating lowpass filter could also be realized with known lowpass integrating filters using voltage amplifiers stages, wherein the resistor and capacitor structures are placed between the amplifier output and the inverting input.

Figure 2:
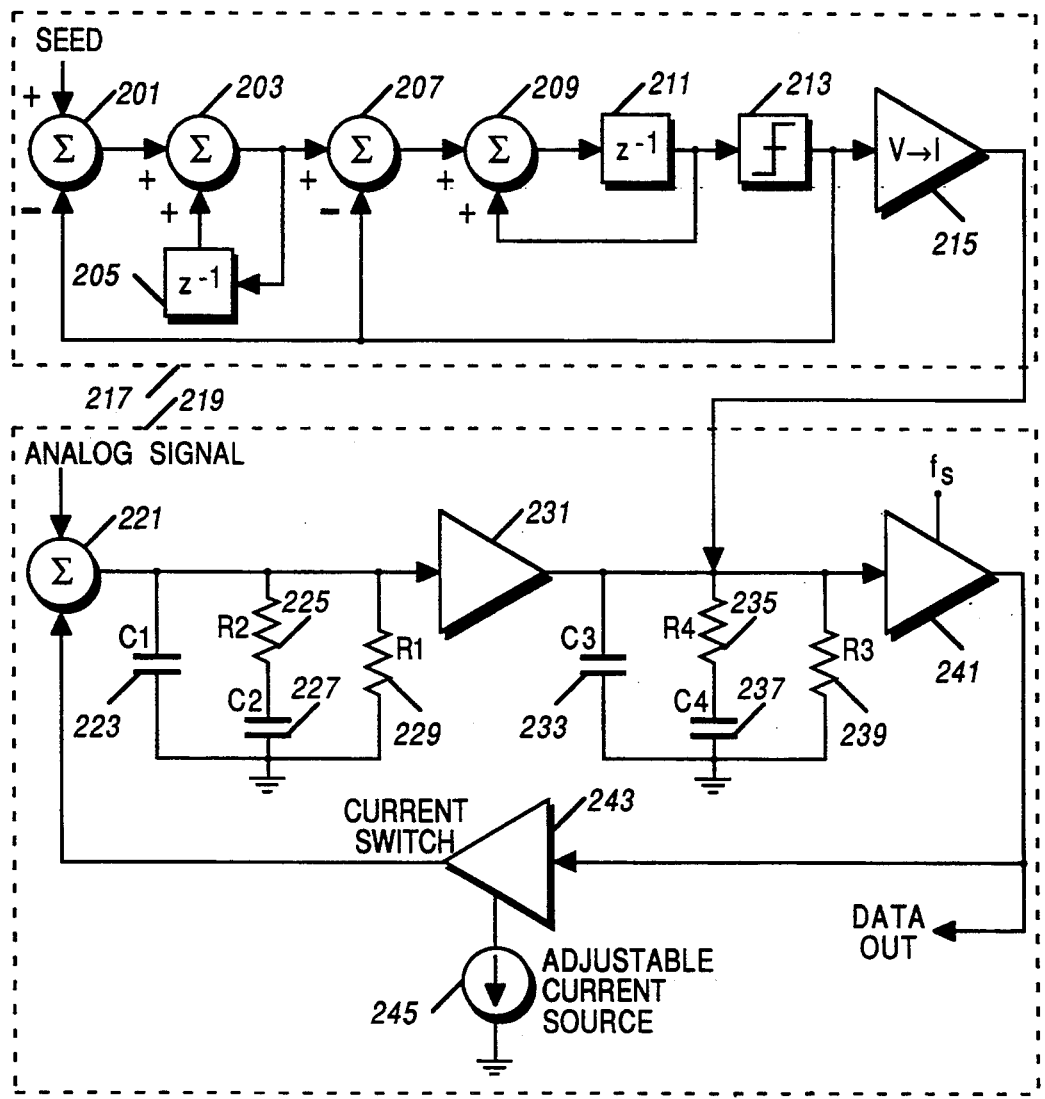
FIG. 2 is a block diagram of a sigma-delta A/D converter with a digital dither noise source in accordance with the invention.

A sigma-delta A/D converter with a digital dither noise source 217 is shown in FIG. 2. A seed is input to the positive input terminal of a first summer 201. The seed is typically a low digital value, such as an offset of one least significant bit. The seed provides an initial condition so all states including the output of the digital dither noise source are not indefinitely zero. The seed value is chosen to be small enough so that when the digital dither noise source 217 is operatively coupled to the sigma-delta A/D 219, no appreciable dc output of the A/D 219 is attributed to the digital dither noise source. The output of the first summer 201 is input to a second summer 203, whose output is input to a delay 205 and also to a positive input terminal of a third summer 207. The output of the third summer 207 is input to a fourth summer 209. The output of the fourth summer 209 is input to a second delay 211. The output of the second delay 211 is input to a second positive terminal of the fourth summer 209 and also to a conventional quantizer 213, which produces a full scale positive output of its input is positive and conversely produces a full scale negative output if its input is negative. The output of the quantizer 213 is input to the negative input terminal of the first summer 201 and the third summer 207. The output of the quantizer 213 is also input to a voltage to current (V→I) converter 215. Thus, a dither noise source 217 is provided by blocks 201, 203, 205, 207, 209, 211, 213, and 215. This dither noise source 217 (not including the voltage to current converter 215) is a sigma-delta digital-to-analog (D/A) modulator. As shown, the digital dither noise source 217 is advantageous in that it is much more easily and reliably implemented on an integrated circuit than is the dither noise source 113 of FIG. 1.

A sigma-delta A/D converter 219 as shown in FIG. 2 functions in the same way as the sigma-delta A/D converter 115 shown in FIG. 1, hence no additional description will be provided. The coupling between dither noise source 113 and sigma-delta A/D converter 115 as well as the coupling between dither noise source 217 and sigma-delta A/D converter 219 removes at least some of the unwanted spectral components from the analog to digital converter output by means of adding a noise-like random pattern within the A/D and changing its output sequence to spread out the undesired tones in frequency to make the output distortion more noise-like and less noticeable. Thus, the unwanted distortion caused by inband tones are substantially removed from the output of the A/D converter. Although a sigma-delta converter is shown in FIG. 1 and FIG. 2, those of skill in the art can appreciate that the dither noise source 217 would also provide inband tone suppression for other A/D converters, such as Flash converters.

Figure 3:
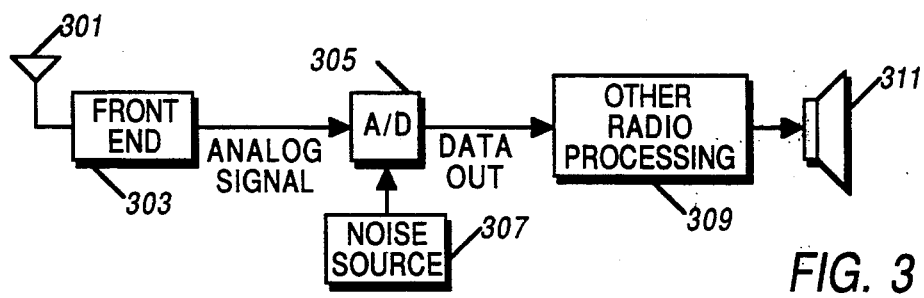
FIG. 3 is a block diagram of a transceiver with a sigma-delta A/D converter and a noise source in accordance with the invention.

A block diagram of a transceiver with a sigma-delta A/D converter and a noise source is shown in FIG. 3. The transceiver comprises a front end 303, which processes a transmitted signal, as received through an antenna 301, into an analog signal. The analog signal is input to an A/D converter 305, such as a sigma-delta A/D converter 115 or 219 as shown in FIG. 1 or FIG. 2. The A/D converter 305 converts the analog signal into a digital output, labeled "DATA OUT." A noise source 307, such as the dither noise source 113 of FIG. 1 or the sigma-delta D/A modulator 217 of FIG. 2, is coupled to the A/D converter 305 so as to remove at least some unwanted spectral components from the digital output. The "DATA OUT" signal is then processed into other useful information by a radio processing block 309, which provides, inter alia, a signal to a speaker 311 for audible reception. If the A/D converter is a sigma-delta A/D converter, the A/D converter may be a second order sigma-delta A/D converter. If the A/D converter is a second order sigma-delta A/D converter, the A/D converter has a first integrator followed by a second integrator, and the noise source is operatively coupled to the second integrator.

The A/D converter shown in FIG. 1 and FIG. 2 is a second order sigma-delta A/D converter. In both FIG. 1 and FIG. 2, the noise source is operatively coupled to the second integrator of the sigma-delta converter. Thus, the unwanted distortion caused by inband tones are substantially removed from the output of the A/D converters shown in FIG. 1 and FIG. 2.

Another positive attribute of this invention is the spectral content of the digital dither noise source. As known by those skilled in the art, the spectral content of a baseband sigma-delta D/A has minimum noise in the low frequency passband. When the digital dither noise source 217, which is a baseband sigma-delta D/A, is operatively coupled to the sigma-delta A/D 219, the noise introduced in the passband is minimized, and therefore does not degrade the passband signal to noise ratio of the sigma-delta A/D 219.

Another positive attribute of this invention is the placement within the baseband sigma-delta whereby the noise source is operatively coupled. The noise source is operatively coupled into the last filter stage of the low-pass integrating filter in the preferred embodiment. Coupling into any other portion of the multi-pole gain stage causes the noise source to be filtered by the additional filtering and degrades the quality of the noise source. Thus, a larger noise source is needed because some of the noise will be filtered out. In the preferred embodiment, no additional summation stage, e.g., within the quantizer, is required because the noise source can be conveniently coupled into the last filter stage of the multi-pole gain stage.

The noise source 217 depicted in FIG. 2 has the positive attribute of being easily and reliably implemented in an integrated circuit. In addition, the implementation requires no components or additional input/output terminals external to the integrated circuit.

What is claimed is:

1. An apparatus comprising:
   an analog-to-digital converter having an output;
   a noise source, wherein the noise source is coupled to the analog-to-digital converter so as to remove at least some unwanted spectral components from the analog-to-digital converter output; and
   wherein the noise source is comprised of a sigma-delta digital-to-analog modulator.

2. The apparatus of claim 1, wherein the analog-to-digital converter is a sigma-delta analog-to-digital converter.

3. The apparatus of claim 1, wherein the analog-to-digital converter is a second order sigma-delta analog-to-digital converter.

4. The apparatus of claim 3, wherein the analog-to-digital converter has a first integrator followed by a second integrator, and wherein the noise source is operatively coupled to the second integrator.

5. An apparatus comprising:
   a sigma-delta analog-to-digital converter having an output;
   a dither noise source, wherein the dither noise source is operatively coupled to the sigma-delta analog-to-digital converter so as to remove at least some unwanted spectral components from the analog-to-digital converter output; and
   wherein the noise source is comprised of a sigma-delta digital-to-analog modulator.

6. The apparatus of claim 5, wherein the sigma-delta analog-to-digital converter is a second order sigma-delta analog-to-digital converter.

7. The apparatus of claim 6, wherein the sigma-delta analog-to-digital converter has a first integrator followed by a second integrator, and wherein the noise source is operatively coupled to the second integrator.

8. An apparatus comprising:
   a sigma-delta analog-to-digital converter having an output and a first integrator followed by a second integrator;
   a dither noise source, wherein the dither noise source is operatively coupled to the second integrator so as to remove at least some unwanted spectral components from the analog-to-digital converter output; and
   wherein the noise source is comprised of a sigma-delta digital-to-analog modulator.

9. The apparatus of claim 8, wherein the sigma-delta analog-to-digital converter is comprised of more than two integrators in a series of integrators, and wherein the second integrator appears last in the series of integrators.

10. A transceiver comprising:
    a front end for processing a transmitted signal into an analog signal;
    an analog-to-digital converter, which converts the analog signal into a digital output;
    a noise source, wherein the noise source is coupled to the analog-to-digital converter so as to remove at least some unwanted spectral components from the digital output; and
    wherein the noise source is comprised of a sigma-delta digital-to-analog modulator.

11. The transceiver of claim 10, wherein the analog-to-digital converter is a sigma-delta analog-to-digital converter.

12. The transceiver of claim 10, wherein the analog-to-digital converter is a second order sigma-delta analog-to-digital converter.

13. The transceiver of claim 12, wherein the analog-to-digital converter has a first integrator followed by a second integrator, and wherein the noise source is operatively coupled to the second integrator.

14. The transceiver of claim 12, wherein the noise source is a digital dither noise source.

* * * * *